(12) United States Patent
Shim et al.

(10) Patent No.: US 7,863,730 B2
(45) Date of Patent: Jan. 4, 2011

(54) ARRAY-MOLDED PACKAGE HEAT SPREADER AND FABRICATION METHOD THEREFOR

(75) Inventors: Il Kwon Shim, Singapore (SG); Kambhampati Ramakrishna, Chandler, AZ (US); Diane Sahakian, Tempe, AZ (US); Seng Guan Chow, Singapore (SG); Dario S. Filoteo, Jr., Singapore (SG); Virgil Cotoco Ararao, Atlanta, GA (US)

(73) Assignee: ST Assembly Test Services Ltd., Singapore (SG)

( * ) Notice: Subject to any disclaimer, the term of this patent is extended or adjusted under 35 U.S.C. 154(b) by 396 days.

(21) Appl. No.: 10/921,377

(22) Filed: Aug. 18, 2004

(65) Prior Publication Data

US 2005/0046015 A1    Mar. 3, 2005

Related U.S. Application Data

(60) Provisional application No. 60/499,080, filed on Aug. 28, 2003.

(51) Int. Cl.
  H01L 23/367   (2006.01)
  H01L 21/98    (2006.01)
(52) U.S. Cl. .................. 257/706; 438/122
(58) Field of Classification Search ............ 438/122, 438/123, 124; 257/717, 706
  See application file for complete search history.

(56) References Cited

U.S. PATENT DOCUMENTS 6,432,749 B1 * 8/2002 Libres ................. 438/122
6,492,739 B2 * 12/2002 Muto et al. ............. 257/787
6,541,310 B1   4/2003 Lo et al.
6,967,126 B2 * 11/2005 Lee et al. ............... 438/122
7,015,072 B2 * 3/2006 Combs et al. ............ 438/122
2002/0024798 A1 * 2/2002 Moden et al. ............ 361/719
2003/0026077 A1 * 2/2003 Wennemuth et al. ........ 361/714
2003/0106212 A1   6/2003 Chao et al.
2003/0134437 A1   7/2003 Lo et al.
2003/0189219 A1 * 10/2003 Houle et al. ............. 257/200
2004/0157362 A1 * 8/2004 Beroz et al. ............. 438/106
2005/0046012 A1 * 3/2005 Ramakrishna et al. ...... 257/706
2005/0184404 A1 * 8/2005 Huang et al. ............ 257/787
2006/0063306 A1 * 3/2006 Choi .................... 438/110
2006/0094161 A1 * 5/2006 Tao ..................... 438/113

OTHER PUBLICATIONS

Merriam-Webster's Collegiate Dictionary, Merriam-Webster, Inc., Tenth Edition, 2001, p. 1102.*
Dictionary.com. Dictionary.com Unabridged (v 1.1). Random House, Inc. http://dictionary.reference.com/browse/slot (accessed: Jun. 11, 2007).*

* cited by examiner

*Primary Examiner*—Evan Pert
(74) *Attorney, Agent, or Firm*—Mikio Ishimaru

(57) ABSTRACT

A method for forming a heat spreader, and the heat spreader formed thereby, are disclosed. An array heat spreader having a plurality of connected heat spreader panels is formed. Slots are formed in opposing sides of the heat spreader panels. Legs are formed on and extending downwardly from each of the heat spreader panels in at least an opposing pair of the slots on the heat spreader panels. The legs are integral with the respective heat spreader panels from which they depend.

20 Claims, 9 Drawing Sheets

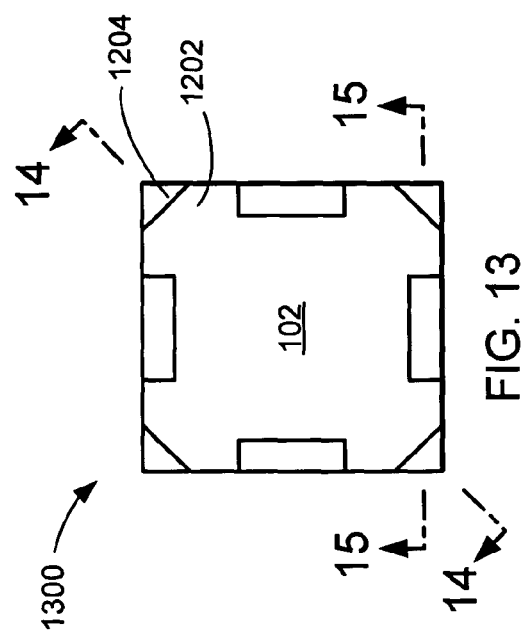
FIG. 13
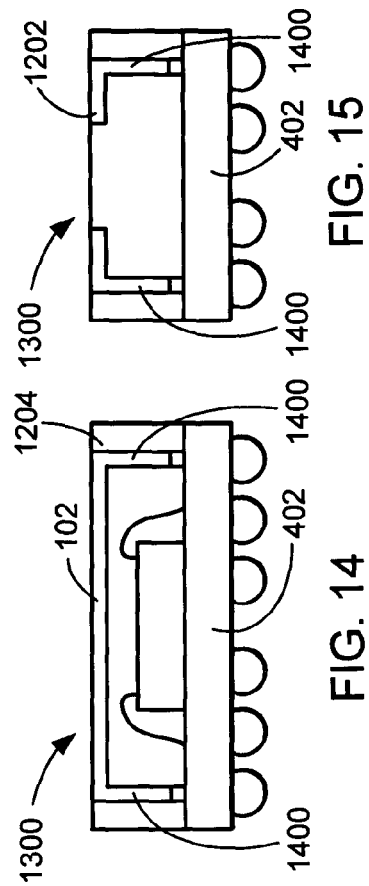
FIG. 14
FIG. 15
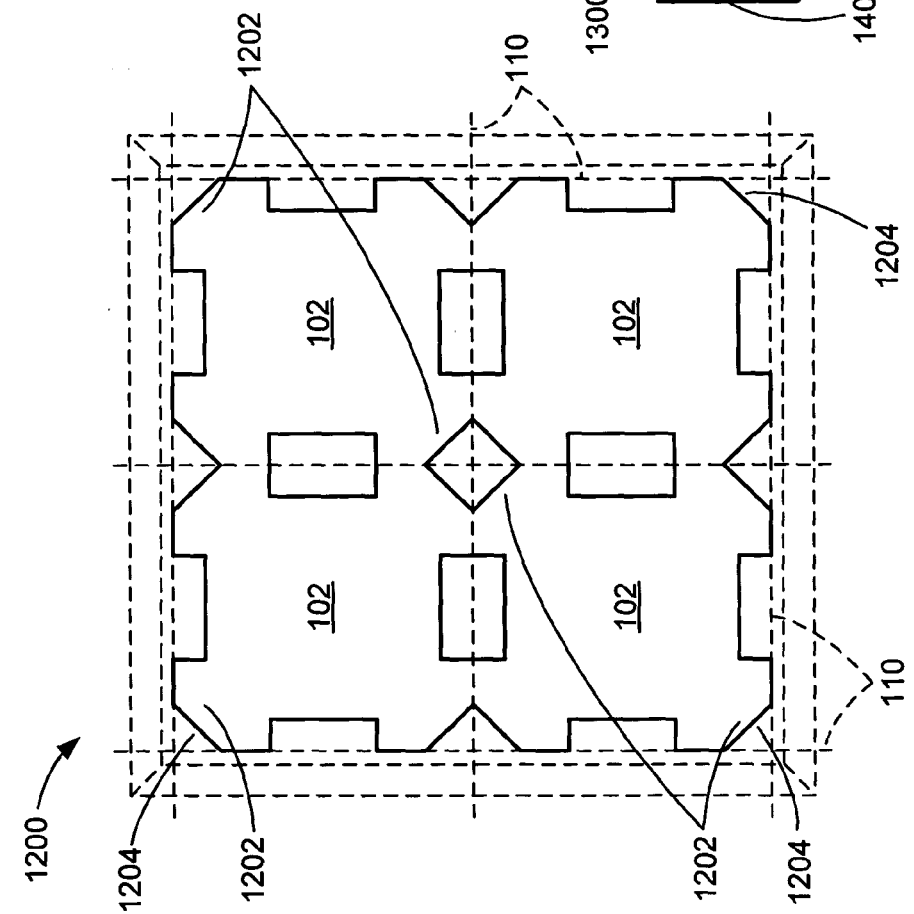
FIG. 12

ARRAY-MOLDED PACKAGE HEAT SPREADER AND FABRICATION METHOD THEREFOR

CROSS-REFERENCE TO RELATED APPLICATION

This application claims the benefit of U.S. Provisional Patent Application Ser. No. 60/499,080 filed Aug. 28, 2003, and the subject matter thereof is hereby incorporated herein by reference thereto.

TECHNICAL FIELD

The present invention relates generally to semiconductor heat dissipation, and more particularly to semiconductor integrated circuit package heat spreaders and methods for the fabrication thereof.

BACKGROUND ART

In the electronics industry, a continuing objective is to further and further reduce the size of electronic devices while simultaneously increasing performance and speed. To accomplish this, increased miniaturization of integrated circuit ("IC") packages for these devices is becoming increasingly essential. Cellular telephones, personal data devices, notebook computers, portable music players, camcorders, and digital cameras are but a few of the consumer products that require and benefit from this ongoing miniaturization of sophisticated electronics.

IC assemblies for such complex electronic systems typically have a large number of interconnected IC chips, or dies. The IC dies are usually made from a semiconductor material such as silicon (Si) or gallium arsenide (GaAs). During manufacture, the several semiconductor devices on the IC dies are formed on the dies in various layers using photolithographic techniques.

After manufacture, the IC dies are typically incorporated into IC packages that may contain one or several such dies. Typically, a die is mounted on the surface of a substrate by a layer of epoxy, and electrical contact pads on the upper surface of the die are then connected to the substrate by gold bond wires. Solder balls can also be provided on the lower surface of the die for additional connections between the die and the substrate. A molding compound then encapsulates the die and the bond wires, providing environmental protection and defining the semiconductor IC package. These IC packages, or modules, are then typically mounted on printed circuit boards.

Heat management through such an IC package structure can be critical. The internal thermal resistance and thermal performance of the packaged die are determined by a series of heat flow paths. By making high heat conductivity connections between the bottom of the die and the package substrate, the heat generated by the die can be transferred efficiently from the die to the substrate and then out of the IC package. Often, however, the amount of heat generated in the die is more than can be efficiently transferred in this manner, thus requiring the attachment of a heat spreader to the top of the IC package.

With the ever-decreasing sizes of electronic devices, die-sized IC packages have been developed in which the dimensions of the IC package are almost the same as those of the semiconductor die that is encapsulated inside the IC package. Such "near-chip-scale" or "near-die-scale" packages (typically up to 17 mm×17 mm) also have low profiles (ranging up to 1.70 mm). Some near-die-scale IC package configurations are molded together in arrays and then separated from one another by saw singulation along the edge lines of the packages. Others are molded individually. Both package designs provide acceptable thermal performance for low power semiconductor devices.

Increasingly, however, higher heat dissipation is needed as device-operating frequencies increase and as devices become progressively denser and more integrated. One solution has been to attach an external heat spreader to the package. Another solution, for individually molded packages, has been to include a "drop-in" heat spreader that is embedded within the package. The "drop-in" heat spreader is so named because it can be fabricated by dropping the heat spreaders into the individual mold cavities prior to molding the packages therein.

With array-molded packages, however, it is very difficult to cost-effectively mold heat spreaders into near-die-scale IC packages. The heat spreaders must be held precisely in position during the molding process and cannot be allowed to interfere with the proper flow of the mold plastic or resin into and through the mold during the molding process. The heat spreaders also must not tear or interfere with the sawing operation when the packages are singulated following the molding operation.

These problems are made even worse by modern, high-performance package configurations. For example, in an effort to improve downward heat conduction to the motherboard, thermally conductive epoxy molding compounds ("EMCs") and multi-layer substrates have been used. However, thermally conductive EMCs are expensive and difficult to process. Moreover, their high filler content increases stresses in the IC packages and on the die surfaces. Multi-layer substrates are also expensive, and they remove heat only through the motherboard. Therefore, internal package heat spreaders may still be needed for such package configurations, especially for a motherboard that has several heat-generating IC packages thereon.

Thus, a need remains for economical, readily manufacturable heat spreaders for small, array-molded, near-die-scale IC packages, and particularly for heat spreaders that can be easily embedded directly within such packages. In view of the ever-increasing need to reduce costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for forming a heat spreader, and the heat spreader that is formed thereby. An array heat spreader having a plurality of connected heat spreader panels is formed. Slots are formed in opposing sides of the heat spreader panels. Legs are formed on and extending downwardly from each of the heat spreader panels in at least an opposing pair of the slots on the heat spreader panels. The legs are integral with the respective heat spreader panels from which they depend. The invention provides an economical, readily manufacturable method for fabricating heat spreaders for small, array-molded, near-die-scale IC packages, and particularly for heat spreaders that can be easily embedded directly within such packages.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 12 is a top view of an array heat spreader according to the present invention with corner blocks having modified tips;

FIG. 13 is a top view of a singulated integrated circuit package fabricated according to the present invention with a heat spreader from a heat spreader array such as shown in FIG. 12;

FIG. 14 is a cross-sectional view of the structure of FIG. 13 taken on line 14-14 in FIG. 13;

FIG. 15 is a cross-sectional view of the structure of FIG. 13 taken on line 15-15 in FIG. 13;

BEST MODE FOR CARRYING OUT THE INVENTION

Figure 2:
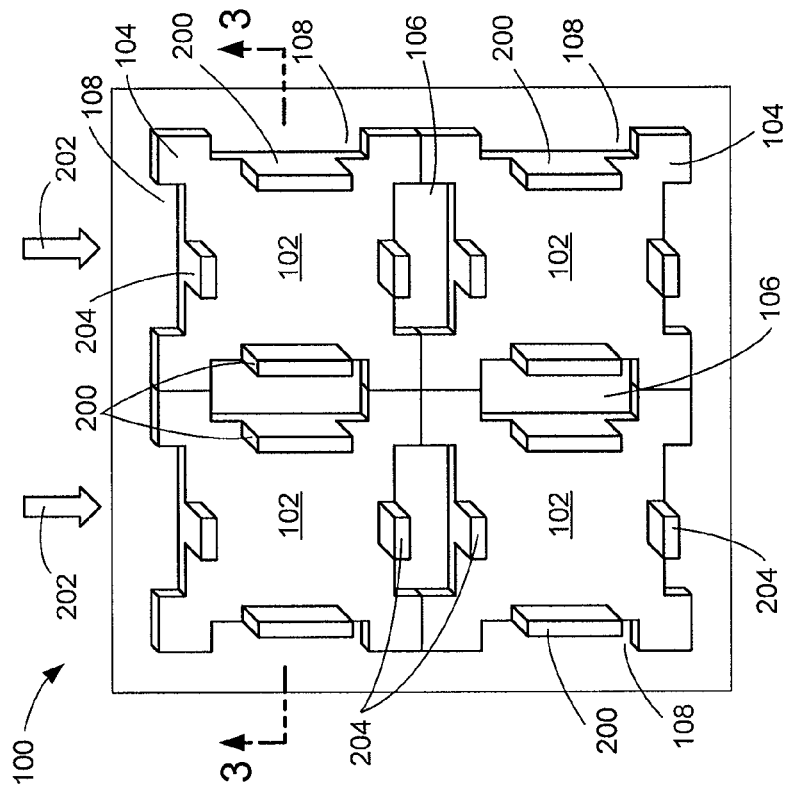
FIG. 2 is a bottom view of the structure of FIG. 1.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

Likewise, the drawings showing embodiments of the invention are semi-diagrammatic and not to scale and, particularly, some of the dimensions are for the clarity of presentation and are shown exaggerated in the FIGs. Also, where multiple embodiments are disclosed and described having some features in common, for clarity and ease of illustration, description, and comprehension thereof, like features one to another will ordinarily be described with like reference numerals.

The term "horizontal" as used herein is defined as a plane parallel to the conventional plane or surface of the heat spreader and any semiconductor die supported thereon, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Figure 1:
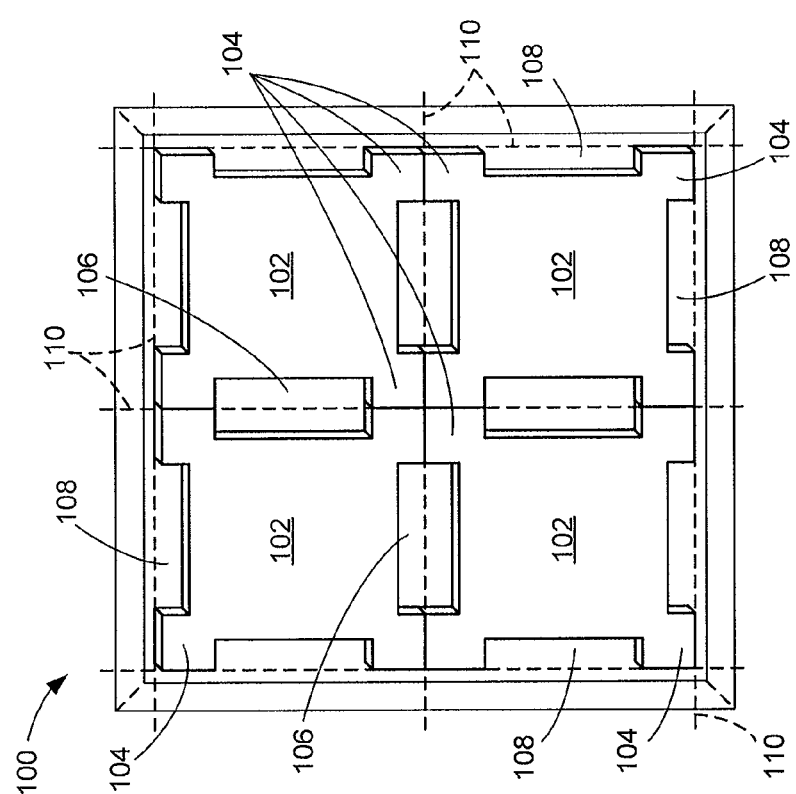
FIG. 1 is a top view of an array heat spreader for small, array-molded, near-die-scale integrated circuit packages in accordance with the present invention.

Referring now to FIG. 1, therein is shown a top view of an array heat spreader 100 in accordance with the present invention. The array heat spreader 100 is particularly well adapted for small, array-molded, near-die-scale integrated circuit ("IC") packages.

The array heat spreader 100 is designed and sized to be received conveniently in a cavity-up mold (see FIG. 4) for manufacturing a low-profile, fine-pitch ball grid array ("LF-BGA") package configuration. Subsequently to the molding, the individual packages are then singulated from one another by saw singulation.

The embodiment of the array heat spreader 100 shown in FIG. 1 is configured for simultaneously array-molding four LFBGA packages under a single mold cap. Based upon this disclosure however, it will be understood that other array-molded package configurations, for example, those having more or fewer packages therein, can also be accommodated by suitably configuring the array heat spreader 100 as needed and appropriate.

The array heat spreader 100 thus includes a heat spreader panel 102 for each package that is being fabricated in the array-molded process. As illustrated, four such heat spreader panels 102 are provided and connected or joined together by corner blocks 104 at the corners thereof. The heat spreader panels 102 are thus arrayed to fit within the entire mold cavity, with one heat spreader panel 102 for each individual package site therein.

Multiple joining and side slots are located in and along the sides of the heat spreader panels 102. Joining slots 106 are located between adjoining heat spreader panels 102, and side slots 108 are located on the sides of the heat spreader panels 102 adjacent the peripheral edges of the array heat spreader 100. The joining slots 106 and the side slots 108 extend horizontally along opposing sides of the heat spreader panels 102 and also extend substantially vertically through a top of the array heat spreader 100 and a bottom of the heat spreader 100.

The slots 106 and 108 perform several functions. For example, they are located on and across saw singulation lines 110 between the corner blocks 104. When the packages (not shown, but see the package 500 in FIGS. 5-8) are completed, saw singulation is performed on the saw singulation lines 110 to separate the individual packages. The slots 106 and 108 facilitate the saw singulation by reducing the metal length that must be cut on the saw singulation lines 110.

The slots 106 and 108 also provide material for forming legs (not shown, but see the legs 200 and 204 in FIG. 2) during the stamping and forming operations that configure the array heat spreader 100.

Referring now to FIG. 2, therein is shown a bottom view of the array heat spreader 100. Each of the heat spreader panels 102 has a pair of legs 200 that are on and extend downwardly from respective opposite edges of each of the heat spreader panels 102. In the embodiment shown, the legs 200 are formed on and extend substantially vertically to each of the heat spreader panels 102 adjacent to at least an opposing pair of the slots thereon (i.e., the joining slots 106 and/or the side slots 108), the legs 200 being integral respectively with the heat spreader panels 102 from which they depend.

The legs 200 are oriented with their major surfaces parallel to the mold flow direction, indicated by arrows 202, in order to present minimal resistance to the flow therethrough of package molding compound when the packages are being fabricated. Additional legs 204 may be provided along the other side edges of the heat spreader panels 102, perpendicular to the mold flow direction (i.e., the arrows 202). As illustrated, the additional legs 204 are narrower than the legs 200 in order to lessen mold flow resistance for the package molding compound. Mold flow resistance may be additionally lessened, and mold flow accordingly improved, by optionally perforating the additional legs 204, for example, with holes (not shown, but see the holes 1608 in FIG. 16).

Figure 3:
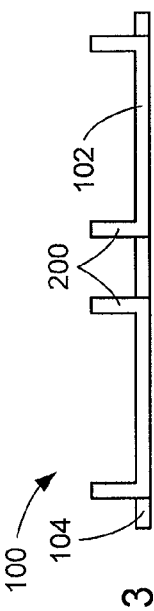
FIG. 3 is a cross-sectional view of the structure of FIG. 2 taken on line 3-3 in FIG. 2.

Referring now to FIG. 3, therein is shown a cross-sectional view of the structure of FIG. 2 taken on line 3-3 in FIG. 2.

Figure 4:
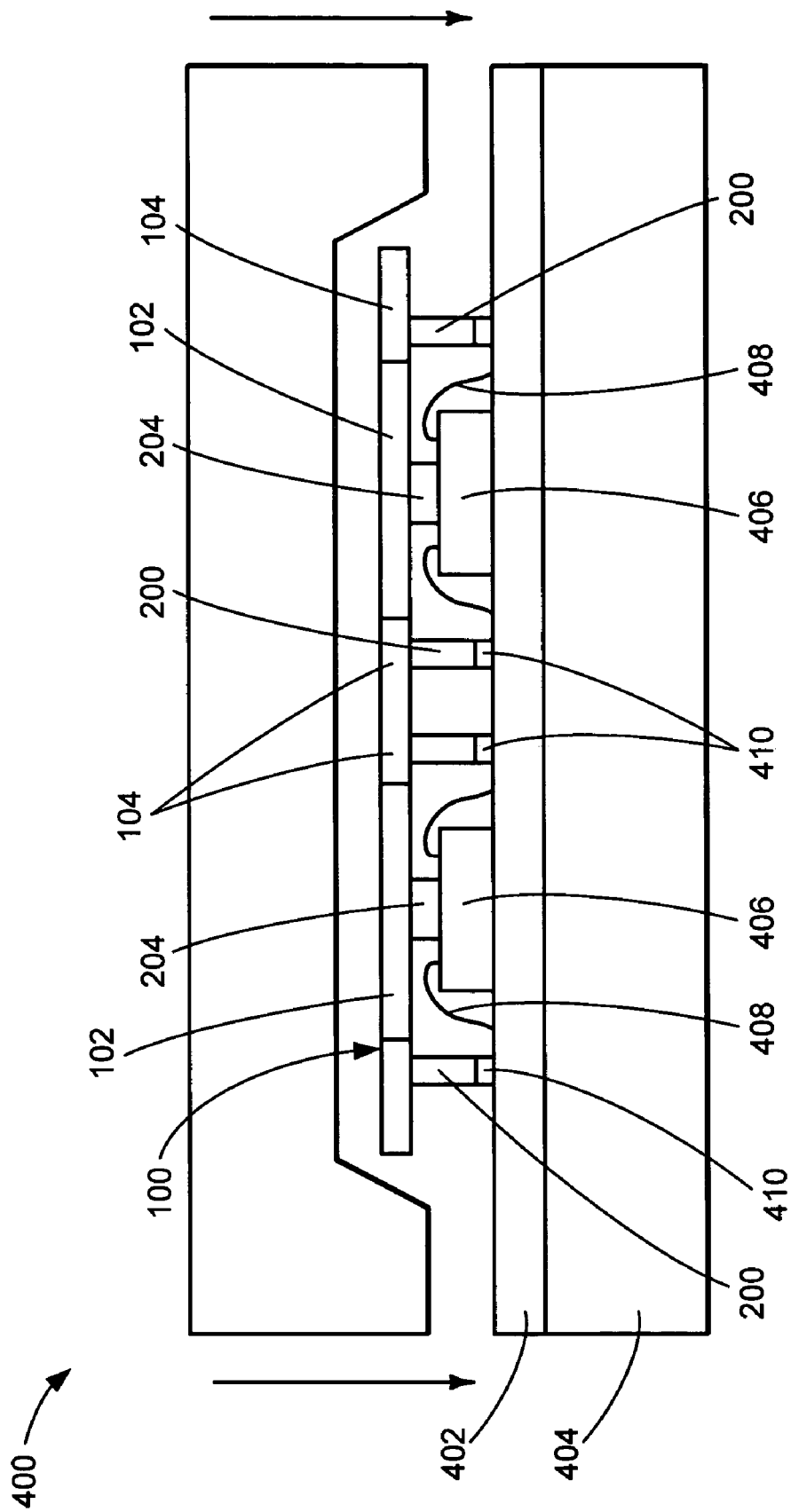
FIG. 4 is a sectional view of a cavity-up mold prepared for encapsulating packages incorporating an array heat spreader according to the present invention.

Referring now to FIG. 4, therein is shown a sectional view of a cavity-up mold 400 prepared for encapsulating packages incorporating the array heat spreader 100. An array substrate 402 has been positioned on the mold chase bottom 404. Dies 406 are attached, as by epoxy, to the array substrate 402 and are connected electrically thereto by bond wires 408. The array heat spreader 100 stands upon the array substrate 402, supported thereon and appropriately spaced therefrom by the legs 200, which function accordingly as stand-off and support legs. An adhesive 410, such as an epoxy adhesive, joins the legs 200 to the array substrate 402. The array heat spreader 100 may optionally be grounded electrically to the array substrate 402 by securing the legs 200 to grounding pads (not shown) on the array substrate 402 with electrically conductive adhesive.

Figure 5:
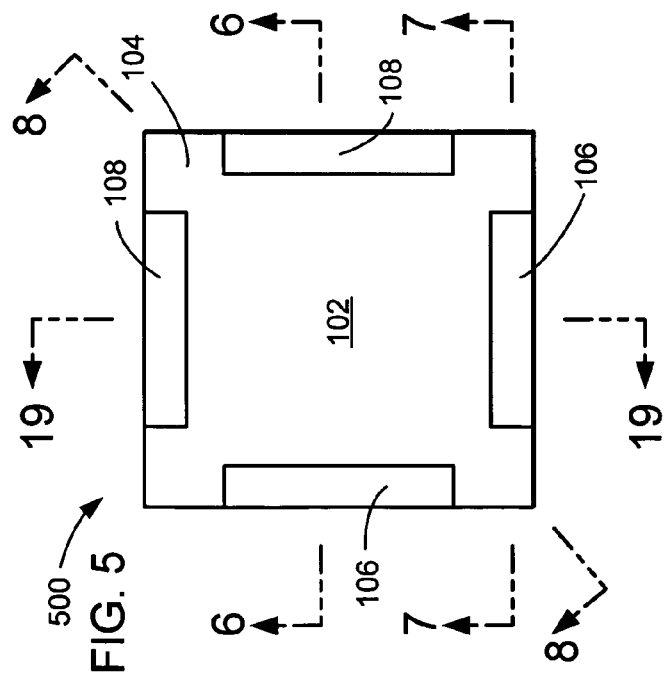
FIG. 5 is a top view of a singulated integrated circuit package fabricated according to the present invention with a heat spreader from a heat spreader array such as shown in FIG. 1.

Referring now to FIG. 5, therein is shown a top view of a singulated IC package 500 after fabrication thereof as illustrated and described in connection with FIG. 4, followed by singulation into a discrete package.

Figure 6:
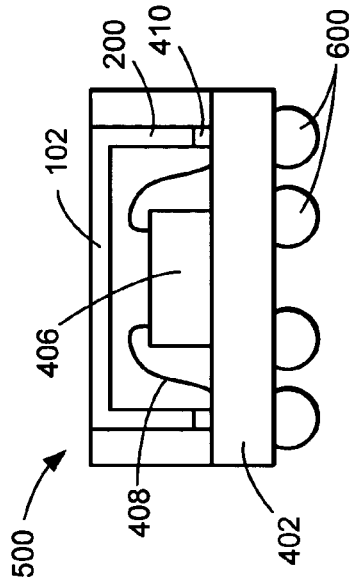
FIG. 6 is a cross-sectional view of the structure of FIG. 5 taken on line 6-6 in FIG. 5.

Referring now to FIG. 6, therein is shown a cross-sectional view of the package 500 taken on line 6-6 in FIG. 5. The bottom of the package may include suitable interface contacts, such as a ball grid array ("BGA") 600 on the bottom surface of the array substrate 402 of the package 500.

Figure 7:
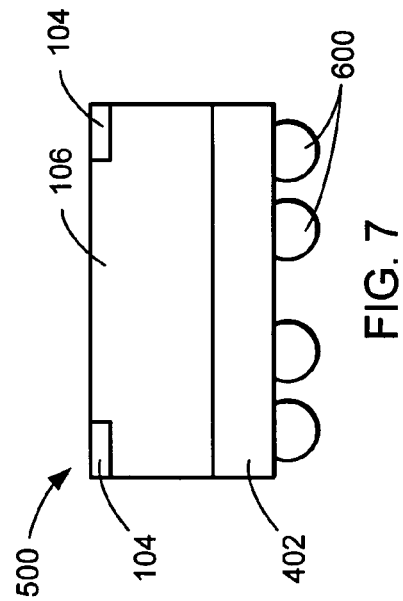
FIG. 7 is a cross-sectional view of the structure of FIG. 5 taken on line 7-7 in FIG. 5.

Referring now to FIG. 7, therein is shown a cross-sectional view of the package 500 taken on line 7-7 in FIG. 5.

Figure 8:
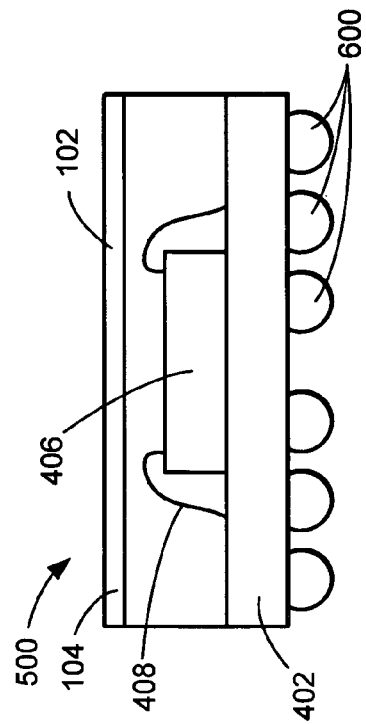
FIG. 8 is a cross-sectional view of the structure of FIG. 5 taken on line 8-8 in FIG. 5.

Referring now to FIG. 8, therein is shown a cross-sectional view of the package 500 taken on line 8-8 in FIG. 5.

Figure 9:
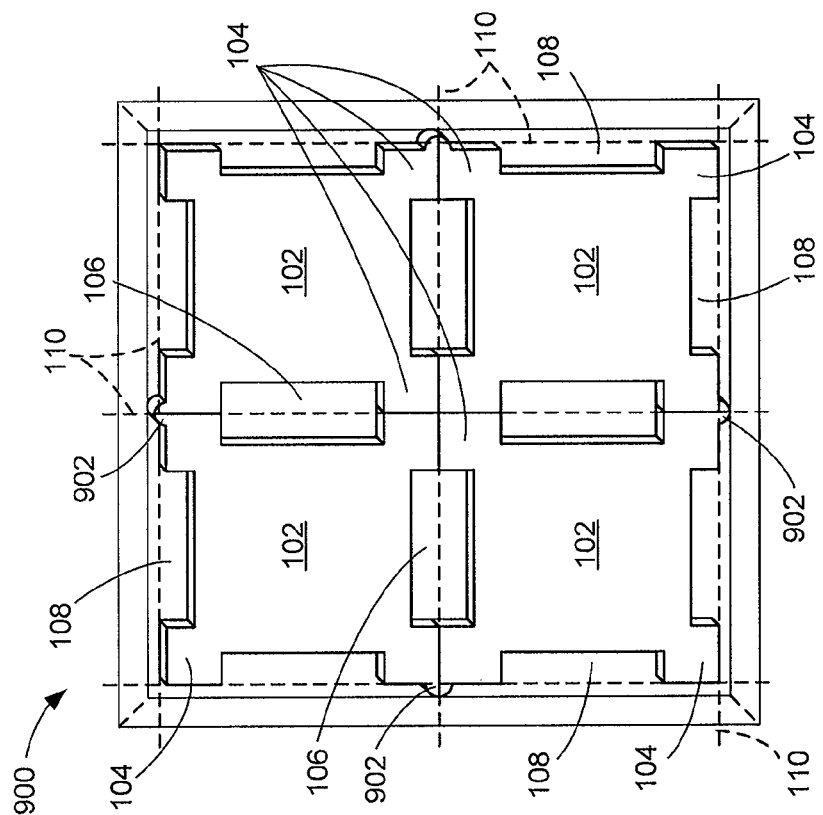
FIG. 9 is a view of an array heat spreader configuration having protrusions on the periphery thereof.

Referring now to FIG. 9, therein is shown an array heat spreader 900 that is substantially the same as the array heat spreader 100 (FIG. 1) except that the array heat spreader 900 is also provided with protrusions 902 on the periphery thereof. The protrusions 902 are located for positioning and centering the array heat spreader 900 in a cavity-down mold (not shown, but see FIG. 11) for molding an array-molded package assembly.

Figure 10:
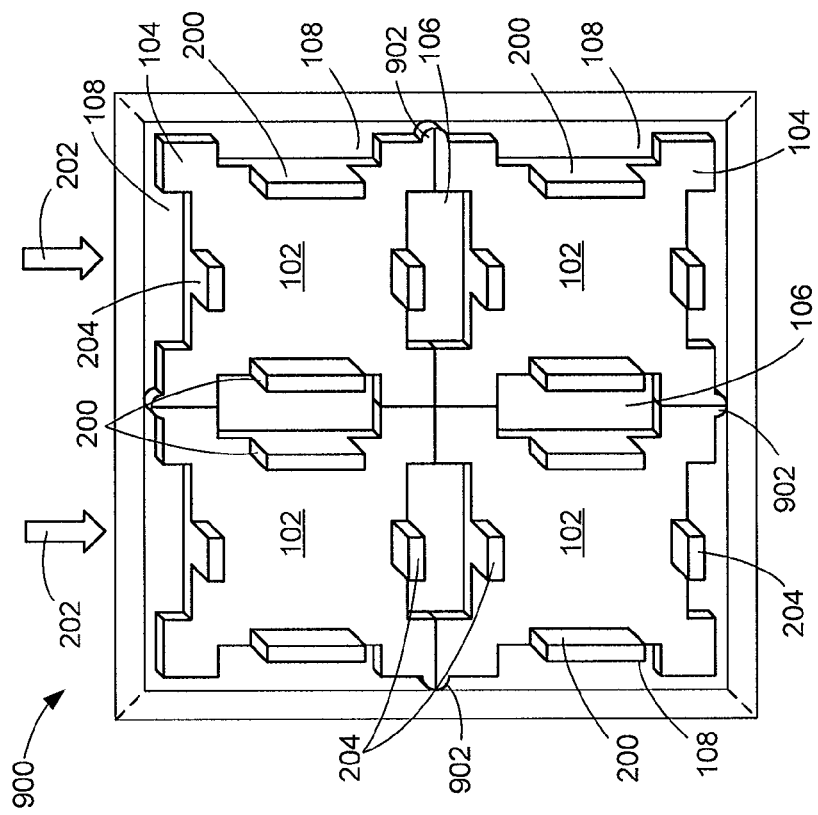
FIG. 10 is a bottom view of the structure of FIG. 9.

Referring now to FIG. 10, therein is shown a bottom view of the array heat spreader 900 illustrated in FIG. 9.

Figure 11:
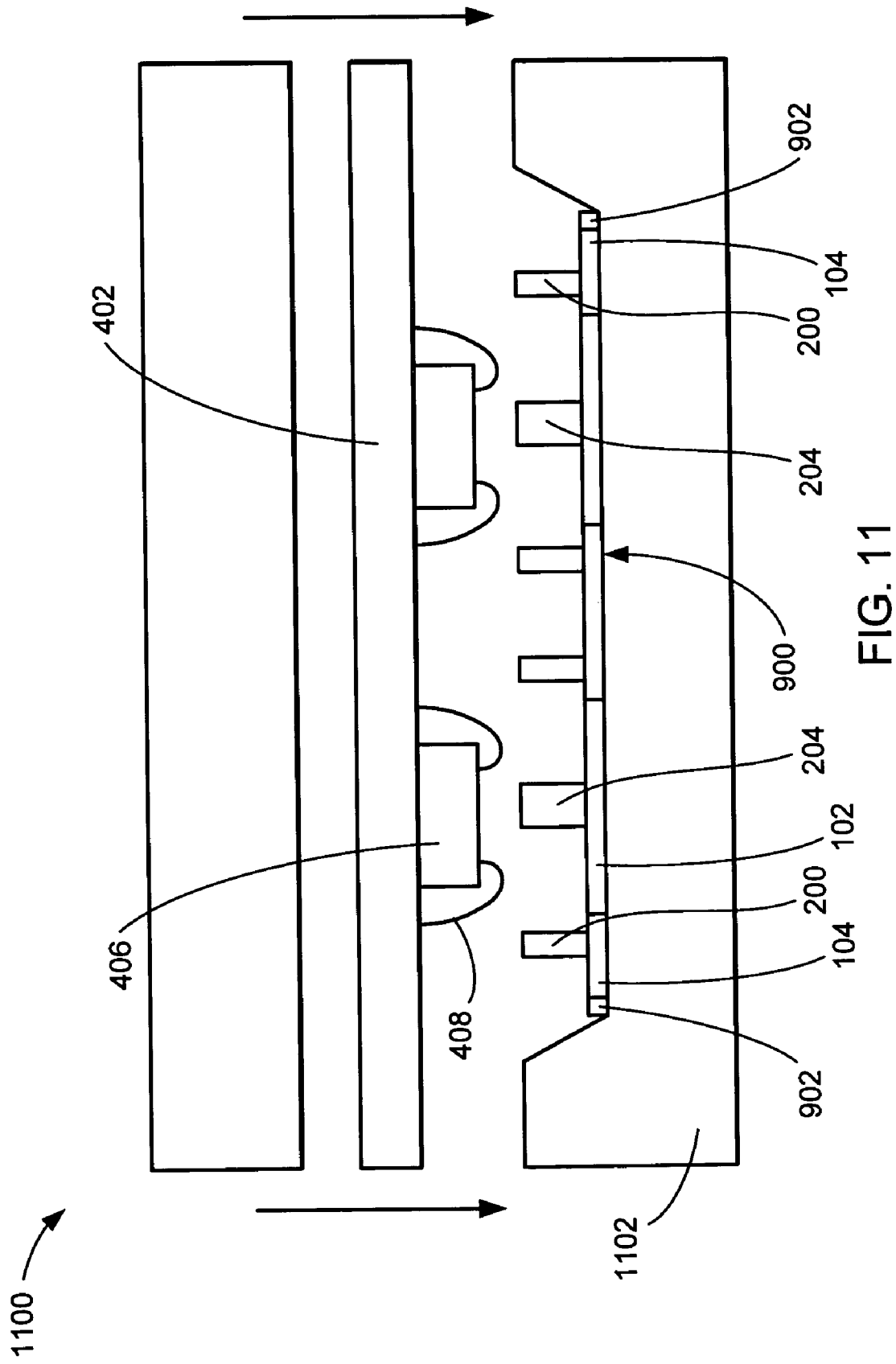
FIG. 11 is a sectional view of a cavity-down mold being prepared for encapsulating packages incorporating an array heat spreader according to the present invention.

Referring now to FIG. 11, therein is shown a cavity-down mold 1100 being prepared for encapsulating and molding four array packages incorporating the array heat spreader 900. The array heat spreader 900 has been inverted and placed in the mold chase bottom 1102, the protrusions 902 properly positioning the array heat spreader 900 therein. The array substrate 402, with the dies 406 thereon, has similarly been inverted and is positioned over the array heat spreader 900. The array substrate 402 is properly spaced from the array heat spreader 900 by the legs 200 and the legs 204 thereon. Following molding, the completed packages will be the same as the packages 500 shown in FIGS. 5-8 since the protrusions 902 are removed upon saw singulation of the completed individual packages.

Referring now to FIG. 12, therein is shown a top view of an array heat spreader 1200 similar to the array heat spreader 100 (FIG. 1). However, the array heat spreader 1200 has corner blocks 1202 in which the tips thereof have been modified to form tip slots 1204 that remove the tips of the corner blocks 1202 from the saw singulation lines 110. This modification reduces the length of the metal along the package saw singulation lines 110.

In one embodiment, the material from the tip slots 1204 of the corner blocks 1202 may simply be removed from the array heat spreader 1200. In another embodiment, the material from the tip slots 1204 may be shaped to form additional legs (not shown, but see additional legs 1400 in FIGS. 14 and 15).

Referring now to FIG. 13, therein is shown a top view of a singulated IC package 1300 incorporating a heat spreader from the array heat spreader 1200.

Referring now to FIG. 14, therein is shown a cross-sectional view of the package 1300 taken on line 14-14 in FIG. 13. Additional legs 1400 have been formed in the heat spreader from the material of the tip slots 1204, extending downwardly to the array substrate 402 of the package 1300.

Referring now to FIG. 15, therein is shown a cross-sectional view of the package 1300 taken on line 15-15 in FIG. 13.

Figure 16:
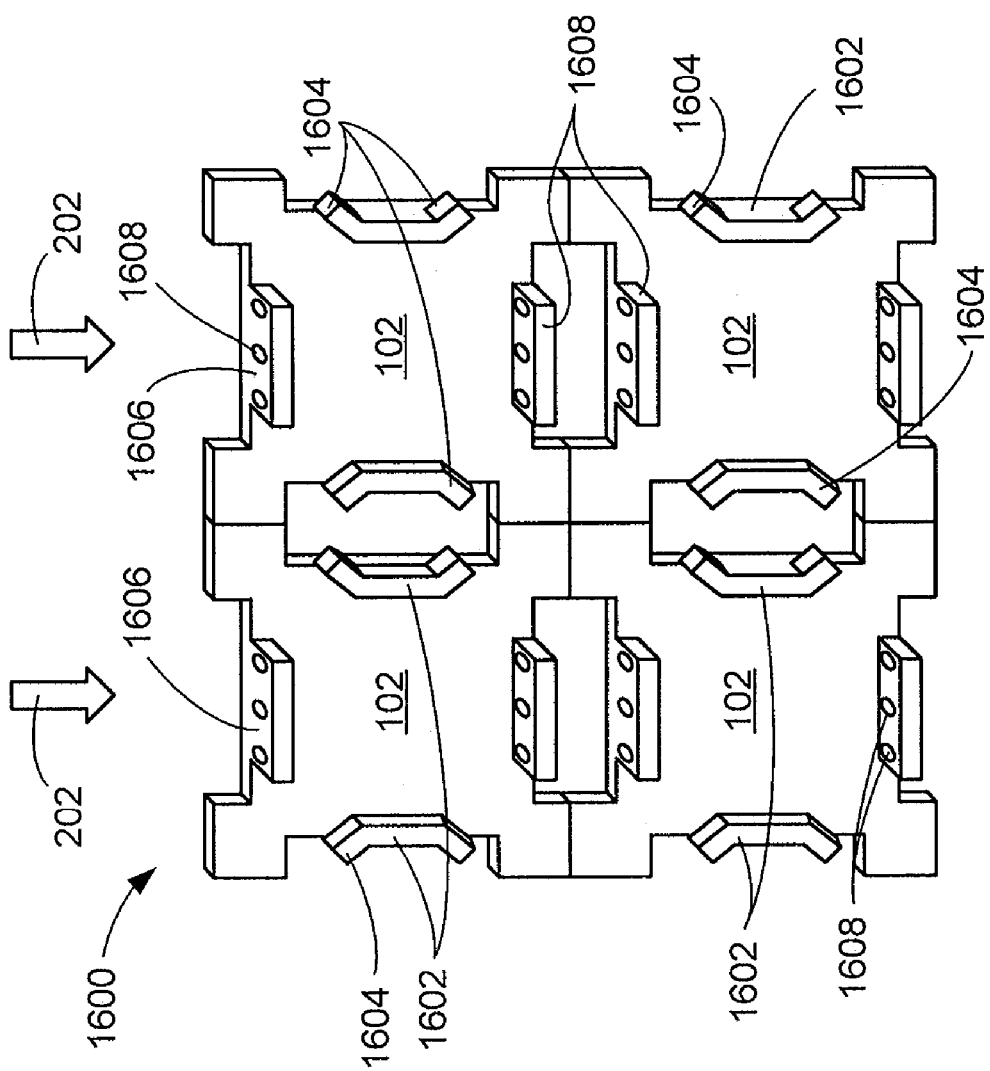
FIG. 16 is a bottom view of an array heat spreader showing several leg modifications.

Referring now to FIG. 16, therein is shown a bottom view of an array heat spreader 1600 incorporating several leg modifications. One such modification is to the legs 1602 that are parallel to the mold flow direction. In particular, the legs 1602 have tabs 1604 formed on the ends thereof that are turned to extend toward the adjacent edges of the packages (not shown) that will be formed therewith. The tabs 1604 that are formed in this manner help to lock the heat spreaders into the mold compound upon completion of the packages.

The array heat spreader 1600 also has additional legs 1606 that are perpendicular to the mold flow direction (i.e., the arrows 202) and are substantially longer in transverse extent than the additional legs 204 (FIG. 2) in the array heat spreader 100 (FIG. 2). The longer dimension of the additional legs 1606 provides additional support for the array heat spreader 1600 and improves locking thereof into the molding compound. However, the longer dimension of the additional legs 1606 may adversely impede the molding compound flow during the encapsulation process. Therefore, to facilitate the mold flow, the additional legs 1606 are provided with holes 1608 therethrough through which the molding compound can more easily flow. The holes 1608 also help to improve the locking of the heat spreader into the molding compound. It will be understood that although the holes 1608 are shown as circular, any suitably shaped opening as appropriate may be utilized, such as square, oblong, and so forth.

Figure 17:
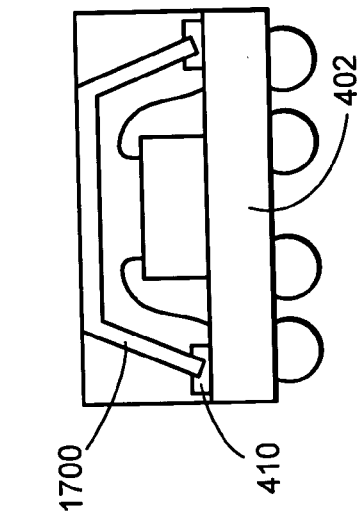
FIG. 17 is a view similar to FIG. 6 depicting another configuration for the legs that are parallel to the mold flow.

Referring now to FIG. 17, therein is shown a view similar to FIG. 6 depicting another configuration for the stand-off and support legs that are oriented parallel to the mold flow. Thus, rather than being vertical, as are the legs 200 (FIG. 6), the legs 1700 (FIG. 17), extending away from the heat spreader panels, are inclined at an angle to the vertical to cause less mechanical stress and less damage to the array substrate 402 during molding of the packages.

Figure 18:
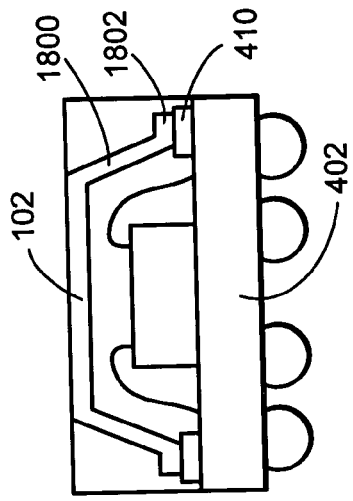
FIG. 18 is a view similar to FIG. 17 depicting a further configuration for the legs.

Referring now to FIG. 18, therein is shown a further configuration for the legs, similar to that shown in FIG. 17. Thus, the legs 1800 (FIG. 18) are inclined similarly to the legs 1700 (FIG. 17), but in addition, the bottoms of the legs 1800 have feet 1802 formed thereon for reducing or eliminating mechanical stress and damage to the array substrate 402 during molding of the packages.

Figure 19:
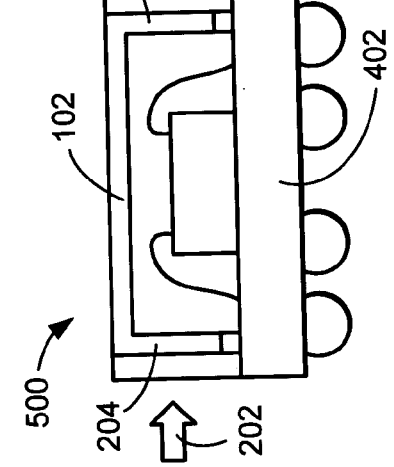
FIG. 19 is shown a cross-sectional view of the structure of FIG. 5 taken on line 19-19 in FIG. 5.

Referring now to FIG. 19, therein is shown a cross-sectional view of the package 500 taken on line 19-19 in FIG. 5.

Figure 20:
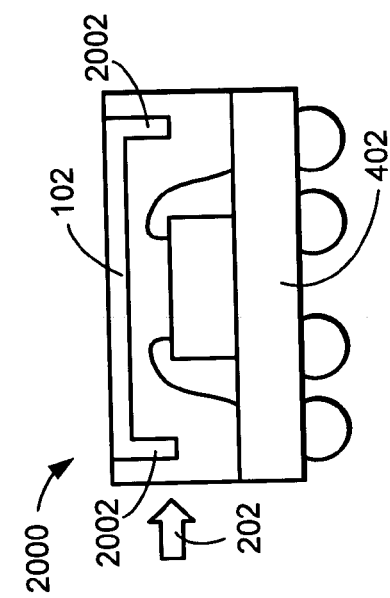
FIG. 20 is a view similar to FIG. 19 of another configuration for the legs.

Referring now to FIG. 20, therein is shown a modification for the additional legs 204 (FIG. 19). As shown in FIG. 20, the additional legs 2002 are shorter than the legs 204, so that the path therebeneath of the mold flow (i.e., the arrows 202) is more open, thereby partially reducing the blockage thereof by the additional legs 2002 relative to the additional legs 204. The additional legs 2002, however, still provide an effective locking function to help secure the heat spreader in the finished package.

Figure 21:
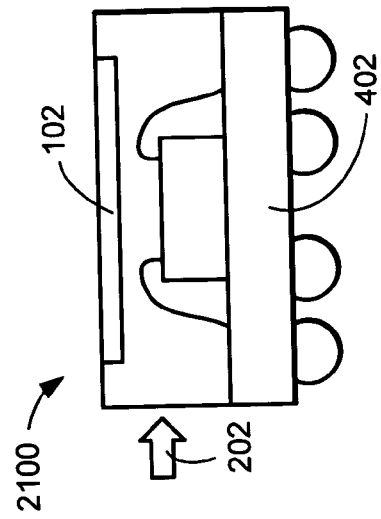
FIG. 21 is a view similar to FIGS. 19 and 20 of a configuration with the legs removed.

Referring now to FIG. 21, therein is shown a view similar to the views of FIGS. 19 and 20 of an embodiment in which additional legs across the mold flow direction have been removed to maximize, as may be needed, the ease of flow for the molding compound.

Figure 22:
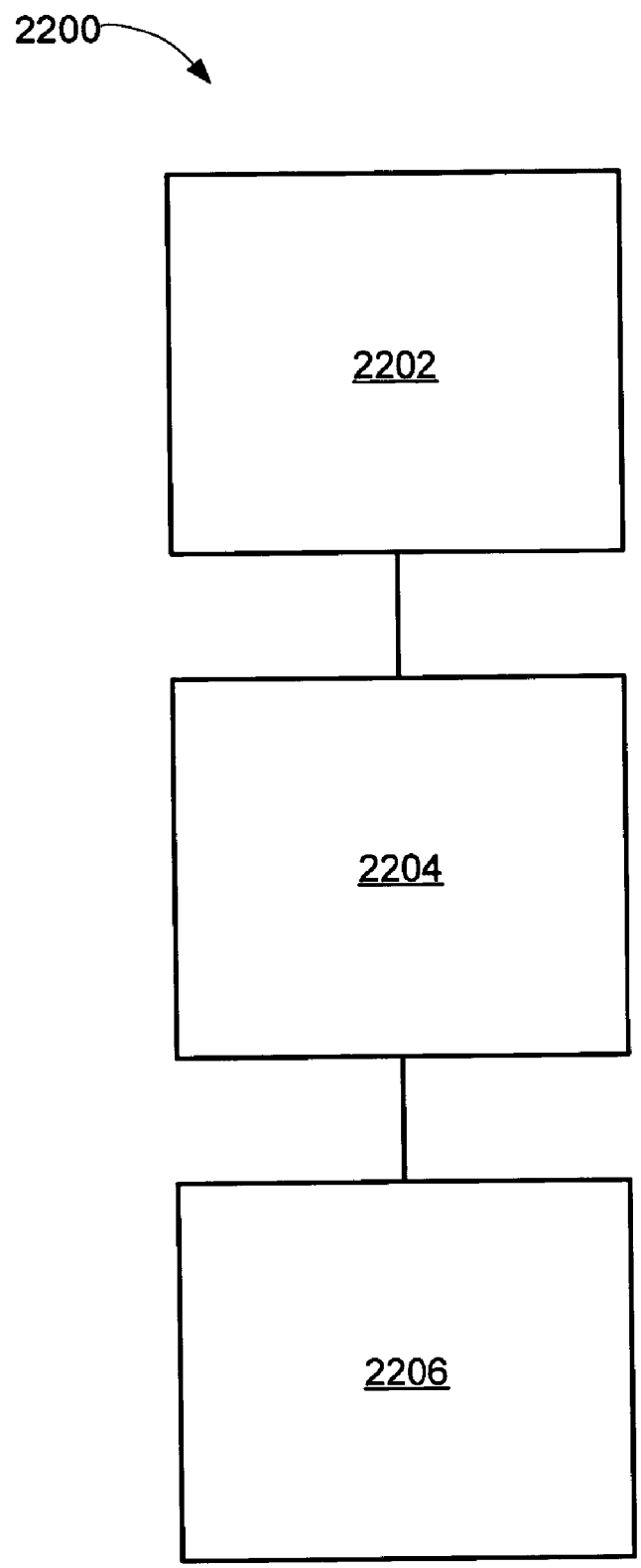
FIG. 22 is a flow chart of a method for forming an array heat spreader in accordance with the present invention.

Referring now to FIG. 22, therein is shown a flow chart of a method 2200 for forming a heat spreader in accordance with the present invention. The method 2200 includes forming an array heat spreader having a plurality of connected heat spreader panels in a block 2202; forming slots in opposing sides of the heat spreader panels in a block 2204; and forming legs on and extending downwardly from each of the heat spreader panels in at least an opposing pair of the slots thereon, the legs being integral with the respective heat spreader panels from which they depend, in a block 2206.

It has been discovered that the array heat spreaders of the present invention can be fabricated with conventional stamping and forming operations. Thus, for example, a suitable, flat, metallic sheet can be stamped to form the various slots of the heat spreader. The stamping operation can further be configured to retain the material for the several heat spreader legs attached to the heat spreader itself. A forming operation can then follow the stamping operation to suitably bend and shape the material for the legs according to the particular configuration that is chosen.

Thus, it has been discovered that the present invention has numerous advantages. It is suitable for both cavity-down and cavity-up mold processes. For cavity-down molding, the array heat spreader can be provided with protrusions for precise positioning into the mold cavity.

Each individual heat spreader package location can be provided with its own support legs, thereby improving the robustness of the molding process. The support legs can optionally be electrically connected to the substrate to provide for grounding the heat spreaders.

An additional advantage is that the support legs can be formed from a single precursor metallic sheet in a conventional, single, combined stamping and forming process, producing support legs that are integral with the heat spreader and reducing the metal length along the package singulation lines for easier saw singulation.

The support legs that are positioned parallel to the mold flow direction may be sized with sufficient length to provide the necessary stand-off and support for the heat spreader during molding. The legs may be straight or may be configured otherwise as appropriate for the application at hand, such as inclined, tabbed, and/or footed.

Support legs that are perpendicular to the mold flow direction may be shortened, perforated, and/or eliminated altogether according to the needs of the particular configuration at hand.

Additionally, the support legs can provide increased locking strength for securing the heat spreaders into the package mold compound. For example, the support legs can be provided with holes therethrough for gripping the molding compound, and/or provided with complex surface configurations, such as for example the tabs 1604 (FIG. 16).

Thus, it has been discovered that the array-molded package heat spreader method and apparatus of the present invention furnish important and heretofore unknown and unavailable solutions, capabilities, and functional advantages for readily and economically manufacturing heat spreaders for small, array-molded, near-die-scale IC packages, and particularly for heat spreaders that can be embedded directly within such packages. The resulting processes and configurations are straightforward, economical, uncomplicated, highly versatile and effective, can be implemented by adapting known technologies, and are thus readily suited for manufacturing embedded heat spreaders for near-die-scale IC packages.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for forming a heat spreader, comprising:
    forming an array heat spreader having a plurality of connected heat spreader panels;
    forming slots in opposing sides of the heat spreader panels, the slots extending horizontally along the heat spreader panels and extending substantially vertically through a top of the array heat spreader and a bottom of the array heat spreader; and
    forming legs from material of the slots, the legs on and extending substantially vertically to each of the heat spreader panels adjacent to at least an opposing pair of the slots thereon, the legs being integral with the respective heat spreader panels from which they depend.

2. The method of claim 1 further comprising forming protrusions on the periphery of the array heat spreader, the protrusions being located for centering the array heat spreader in a cavity-down mold.

3. The method of claim 1 further comprising forming tip slots and legs in the corners of the array heat spreader.

4. The method of claim 1 further comprising forming at least one of:
    an opening through at least one of the legs; and
    at least one tab on at least one of the legs.

5. The method of claim 1 further comprising forming at least one of:
    at least one inclined leg extending away from the heat spreader panels; and
    feet on the bottom of at least one of the legs.

6. A method for forming a heat spreader, comprising:
    forming an array heat spreader having a plurality of connected heat spreader panels;
    forming slots in all the sides of the heat spreader panels, the slots extending horizontally along the heat spreader panels and substantially vertically through a top of the array heat spreader and a bottom of the array heat spreader;
    forming stand-off and support legs from material of the slots, the legs on and extending substantially vertically to each of the heat spreader panels adjacent to all the slots thereon, the legs being integral with the respective heat spreader panels from which they depend;

encapsulating the heat spreader panels and legs in a molding compound; and singulating individual packages from the encapsulated heat spreader panels and legs.

7. The method of claim 6 further comprising forming protrusions on the periphery of the array heat spreader, the protrusions being located for centering the array heat spreader in a cavity-down mold.

8. The method of claim 6 further comprising forming tip slots and legs in the corners of the array heat spreader.

9. The method of claim 6 further comprising forming at least one of:

an opening through at least one of the legs; and at least one tab on at least one of the legs.

10. The method of claim 6 further comprising forming at least one of:

at least one inclined leg extending away from the heat spreader panels; and feet on the bottom of at least one of the legs.

11. A heat spreader, comprising:

an array heat spreader having a plurality of connected heat spreader panels;

means forming slots in opposing sides of the heat spreader panels, the slots extended horizontally along the heat spreader panels and extended substantially vertically through a top of the array heat spreader and a bottom of the array heat spreader; and legs on and extending downwardly from each of the heat spreader panels in at least an opposing pair of the slots thereon, the legs being integral with the respective heat spreader panels from which they depend and including material from the slots.

12. The heat spreader of claim 11 further comprising protrusions on the periphery of the array heat spreader, the protrusions being located for centering the array heat spreader in a cavity-down mold.

13. The heat spreader of claim 11 further comprising tip slots and legs in the corners of the array heat spreader.

14. The heat spreader of claim 11 further comprising at least one of:

an opening through at least one of the legs; and at least one tab on at least one of the legs.

15. The heat spreader of claim 11 further comprising at least one of:

at least one inclined leg extending away from the heat spreader panels; and feet on the bottom of at least one of the legs.

16. A heat spreader, comprising:

an array heat spreader having a plurality of connected heat spreader panels;

means forming slots in all the sides of the heat spreader panels;

stand-off and support legs on and extending downwardly from each of the heat spreader panels in all the slots thereon, the legs being integral with the respective heat spreader panels from which they depend; and a molding compound encapsulating the heat spreader panels and legs.

17. The heat spreader of claim 16 further comprising protrusions on the periphery of the array heat spreader, the protrusions being located for centering the array heat spreader in a cavity-down mold.

18. The heat spreader of claim 16 further comprising tip slots and legs in the corners of the array heat spreader.

19. The heat spreader of claim 16 further comprising at least one of:

an opening through at least one of the legs; and at least one tab on at least one of the legs.

20. The heat spreader of claim 16 further comprising at least one of:

at least one inclined leg extending away from the heat spreader panels; and feet on the bottom of at least one of the legs.

* * * * *